US012593538B2

(12) United States Patent
Cao et al.

(10) Patent No.: US 12,593,538 B2
(45) Date of Patent: Mar. 31, 2026

(54) LIGHT EMITTING SUBSTRATE AND PREPARATION METHOD THEREFOR, AND DISPLAY DEVICE

(71) Applicants: BOE MLED Technology Co., Ltd., Beijing (CN); BOE Technology Group Co., Ltd., Beijing (CN)

(72) Inventors: Pengjun Cao, Beijing (CN); Pei Li, Beijing (CN); Jinpeng Li, Beijing (CN); Jian Li, Beijing (CN); Teng Zhang, Beijing (CN); Kangle Chang, Beijing (CN); Zhaohui Li, Beijing (CN); Zhifu Yang, Beijing (CN)

(73) Assignees: BOE MLED Technology Co., Ltd., Beijing (CN); BOE Technology Group Co., Ltd., Beijing (CN)

( * ) Notice: Subject to any disclaimer, the term of this patent is extended or adjusted under 35 U.S.C. 154(b) by 428 days.

(21) Appl. No.: 18/019,823

(22) PCT Filed: Feb. 10, 2022

(86) PCT No.: PCT/CN2022/075920
§ 371 (c)(1),
(2) Date: Feb. 6, 2023

(87) PCT Pub. No.: WO2022/242244
PCT Pub. Date: Nov. 24, 2022

(65) Prior Publication Data
US 2023/0343895 A1 Oct. 26, 2023

(30) Foreign Application Priority Data

May 19, 2021 (CN) .......................... 202110546151.7

(51) Int. Cl.
*H10H 20/82* (2025.01)
*H10H 20/821* (2025.01)
(Continued)

(52) U.S. Cl.
CPC ........ *H10H 20/821* (2025.01); *H10H 20/841* (2025.01); *H10H 20/8514* (2025.01);
(Continued)

(58) Field of Classification Search
CPC ............... H10H 20/821; H10H 20/841; H10H 20/8514; H10H 20/853; H10H 20/857;
(Continued)

(56) References Cited

U.S. PATENT DOCUMENTS 4,274,217 A * 6/1981 Ohshima ................... G09F 9/33
40/451
7,598,101 B2 * 10/2009 Park ..................... H10H 20/856
438/26
(Continued)

FOREIGN PATENT DOCUMENTS

CN 102800790 A 11/2012
CN 105005111 A * 10/2015
(Continued)

OTHER PUBLICATIONS

International Search Report for PCT/CN2022/075920 Mailed Apr. 11, 2022.
(Continued)

*Primary Examiner* — Monica D Harrison
*Assistant Examiner* — David M Helberg
(74) *Attorney, Agent, or Firm* — Ling Wu; Stephen Yang; Ling and Yang Intellectual Property

(57) ABSTRACT

A light emitting substrate, comprising a base substrate, a retaining wall disposed on the base substrate, and a plurality of light emitting diodes. The retaining wall defines a plurality of partitions on the base substrate, and at least one light emitting diode is provided in at least one partition.

19 Claims, 6 Drawing Sheets

(51) Int. Cl.

| | |
|---|---|
| *H10H 20/841* | (2025.01) |
| *H10H 20/851* | (2025.01) |
| *H10H 20/853* | (2025.01) |
| *H10H 20/857* | (2025.01) |
| *H10H 29/14* | (2025.01) |

(52) U.S. Cl.
CPC ........ *H10H 20/853* (2025.01); *H10H 20/857* (2025.01); *H10H 29/142* (2025.01)

(58) Field of Classification Search
CPC .............. H10H 29/142; H10H 20/856; H10H 20/0362; H10H 20/8515; H10H 20/852; H10H 20/882; H10H 20/855; G02F 1/133605; G02F 1/133607; G02F 1/133603; H01L 25/0753; H01L 25/167; H10D 86/40; H10D 86/60; G09F 9/33
See application file for complete search history.

(56) References Cited

U.S. PATENT DOCUMENTS

| | | | | |
|---|---|---|---|---|
| 10,613,389 | B2 * | 4/2020 | Liu | .................... G02F 1/133603 |
| 11,670,739 | B2 * | 6/2023 | Hong | .................... H10H 20/857 257/79 |
| 11,978,725 | B2 * | 5/2024 | Yamada | ............... H10H 20/857 |
| 12,249,596 | B2 * | 3/2025 | Kang | ..................... H10D 86/00 |
| 2004/0028895 | A1 * | 2/2004 | Yamakami | ................. C09J 7/29 428/354 |
| 2007/0085101 | A1 | 4/2007 | Kim | |
| 2007/0267972 | A1 | 11/2007 | Menegus et al. | |
| 2009/0166657 | A1 | 7/2009 | Yamada et al. | |
| 2017/0103972 | A1 | 4/2017 | Yamada et al. | |
| 2018/0033926 | A1 | 2/2018 | Nonogawa | |
| 2018/0182940 | A1 | 6/2018 | Yamamoto et al. | |
| 2019/0285950 | A1 | 9/2019 | Liu et al. | |
| 2021/0119087 | A1 | 4/2021 | Kim | |

FOREIGN PATENT DOCUMENTS

| | | | | | |
|---|---|---|---|---|---|
| CN | 105914224 | A | | 8/2016 | |
| CN | 106816456 | A | | 6/2017 | |
| CN | 107204404 | A | | 9/2017 | |
| CN | 206685390 | U | * | 11/2017 | |
| CN | 109116631 | A | * | 1/2019 | ....... G02F 1/133603 |
| CN | 110767646 | A | | 2/2020 | |
| CN | 111290172 | A | * | 6/2020 | |
| CN | 211237579 | U | | 8/2020 | |
| CN | 113161332 | A | | 7/2021 | |
| EP | 4207280 | A1 | | 7/2023 | |
| JP | 2009164157 | A | | 7/2009 | |
| JP | 2018022683 | A | | 2/2018 | |
| JP | 2020057595 | A | | 4/2020 | |
| JP | 2021034212 | A | | 3/2021 | |
| WO | 2013114977 | A1 | | 8/2013 | |
| WO | 2019220246 | A1 | | 11/2019 | |
| WO | 2020258878 | A1 | | 12/2020 | |

OTHER PUBLICATIONS

Office Action dated Sep. 26, 2021 for Chinese Patent Application No. 202121080146.3 and English Translation.
European Search Report for 22803574.7 Mailed Mar. 25, 2024.
Office Action dated Dec. 20, 2024 for CN 202110546151.7 and English Translation.
Office Action dated Jun. 20, 2025 for CN2022101264641 and English Translation.
Office Action dated Oct. 14, 2025 for JP 2023-525592 and English Translation.

* cited by examiner

LIGHT EMITTING SUBSTRATE AND PREPARATION METHOD THEREFOR, AND DISPLAY DEVICE

CROSS-REFERENCE TO RELATED APPLICATION

The present application is a U.S. National Phase Entry of International Application No. PCT/CN2022/075920 having an international filing date of Feb. 10, 2022, which claims priority to Chinese Patent Application No. 202110546151.7 filed to the CNIPA on May 19, 2021 and entitled "Light Emitting Substrate and Preparation Method Therefor, and Display device". The above-identified applications are incorporated into the present application by reference in their entireties.

TECHNICAL FIELD

The present disclosure relates to, but is not limited to, display technologies, and particularly to a light emitting substrate and a preparation method therefor, and a display device.

BACKGROUND

A semiconductor Light Emitting Diode (LED) technology has developed for nearly 30 years, from an initial solid-state lighting power supply to a backlight in the display field, and then to an LED display screen, providing a solid foundation for its wider applications. Herein, with development of chip fabrication and an encapsulation technology, a backlight adopting a sub-millimeter-scale or even micron-scale Micro LED has been widely used.

SUMMARY

The following is a summary of subject matters described herein in detail. The summary is not intended to limit the protection scope of claims.

Embodiments of the present disclosure provide a light emitting substrate and a preparation method therefor, and a display device.

In one aspect, an embodiment of the present disclosure provides a light emitting substrate, which includes a base substrate, a retaining wall disposed on the base substrate, and multiple light emitting diodes. The retaining wall defines multiple partitions on the base substrate, and at least one light emitting diode is provided in at least one partition.

In some exemplary embodiments, in two cross sections of the retaining wall parallel to a plane in which the base substrate is located, an area of a cross section close to the base substrate is larger than an area of a cross section away from the base substrate.

In some exemplary embodiments, a material of the retaining wall includes a reflective material.

In some exemplary embodiments, a surface of a side of the retaining wall away from the base substrate is a circular arc surface.

In some exemplary embodiments, the retaining wall includes at least one of the following: multiple strip structures extending in a horizontal direction, and multiple strip structures extending in a vertical direction.

In some exemplary embodiments, a side surface of the retaining wall close to adjacent light emitting diodes is an arc surface or an inclined surface.

In some exemplary embodiments, the retaining wall is a mesh structure, the mesh structure includes at least one mesh.

In some exemplary embodiments, at least one mesh surrounds at least one light emitting diode.

In some exemplary embodiments, numbers of light emitting diodes surrounded by different meshes are different.

In some exemplary embodiments, each mesh surrounds four light emitting diodes arranged in a matrix.

In some exemplary embodiments, centerlines of light emitting surfaces of two adjacent light emitting diodes are located in a first plane, and the first plane is perpendicular to a plane in which the base substrate is located.

In some exemplary embodiments, a retaining wall extending in a single direction is provided between the two adjacent light emitting diodes.

In some exemplary embodiments, a shape of a cross section of the retaining wall in the first plane is semicircular or trapezoidal.

In some exemplary embodiments, in the first plane, a length of the retaining wall in a first direction gradually decreases from the base substrate to a side away from the base substrate; the first direction is parallel to the first plane and intersects with a centerline of a light emitting surface of the light emitting diode.

In some exemplary embodiments, in the first plane, a ratio of a distance W3 between adjacent edges of the two adjacent light emitting diodes in a first direction to a length W1 of an orthographic projection of a retaining wall between the two adjacent light emitting diodes on the base substrate is about 4.0 to 5.5; the first direction is parallel to the first plane and intersects with a centerline of a light emitting surface of the light emitting diode.

In some exemplary embodiments, in the first plane, a ratio of a maximum length H1 of the retaining wall in a second direction to a length W1 of an orthographic projection of a retaining wall between the two adjacent light emitting diodes on the base substrate is about 0.5 to 0.8, the second direction is located in the same plane as the first direction and is perpendicular to the first direction, and the first direction is parallel to the first plane and intersects with a centerline of a light emitting surface of the light emitting diode.

In some exemplary embodiments, in the first plane, the length W1 of the orthographic projection of the retaining wall between the two adjacent light emitting diodes on the base substrate is 0.72 mm to 0.88 mm; the maximum length H1 of the retaining wall along the second direction is 0.45 mm to 0.55 mm.

In some exemplary embodiments, the light emitting substrate further includes a light transmission protection layer covering the multiple light emitting diodes.

In some exemplary embodiments, a thickness of the light transmission protection layer corresponding to a geometrical central portion of each partition is greater than thicknesses of the light transmission protection layer corresponding to other regions.

In some exemplary embodiments, the light transmission protection layer has a first surface away from the base substrate, and the first surface has multiple concave structures.

In some exemplary embodiments, each of the multiple concave structures corresponds to each of the multiple light emitting diodes one-to-one, and an orthographic projection of one concave structure on the base substrate includes an orthographic projection of one light emitting diode on the base substrate.

In some exemplary embodiments, a concave structure has a hemispherical shape, and a center of a light emitting surface of the light emitting diode is located on a central axis of the hemispherical shape.

In some exemplary embodiments, in the first plane, a length W2 of an orthographic projection of a concave structure on the base substrate is about 0.72 mm to 0.88 mm.

In some exemplary embodiments, a distance H3 between a plane of the first surface of the light transmission protection layer other than a concave structure and a surface of the light emitting diode away from the base substrate is about 0.144 mm to 0.176 mm.

In some exemplary embodiments, an orthographic projection of the light transmission protection layer on the base substrate is partially overlapped with an orthographic projection of the retaining wall on the base substrate.

In some exemplary embodiments, a maximum thickness of the light transmission protection layer is less than or equal to a maximum thickness of the retaining wall, wherein a thickness is a distance between a surface on a side away from the base substrate and a surface on a side close to the base substrate.

In some exemplary embodiments, a maximum thickness of the light transmission protection layer is about 0.36 mm to 0.44 mm.

In some exemplary embodiments, the light emitting substrate further includes a diffusion film, a color conversion film, and a brightness enhancement film sequentially disposed on a side of the light transmission protection layer away from the base substrate.

In some exemplary embodiments, the light emitting substrate further includes a reflective layer and a pad pin disposed on the base substrate; the reflective layer is located on a side of the retaining wall close to the base substrate, and the reflective layer exposes at least part of the pad pin; the pad pin is connected to the light emitting diode.

In some exemplary embodiments, a material of the reflective layer includes white ink.

In some exemplary embodiments, in a plane perpendicular to the light emitting substrate, there is spacing between an edge of the reflective layer and an edge of an adjacent light emitting diode.

In some exemplary embodiments, the light emitting substrate further includes a drive circuit, which is a micro integrated circuit having a size on an order of micron or a pixel circuit including a thin film transistor.

In some exemplary embodiments, the drive circuit is covered by a light transmission protection layer.

In some exemplary embodiments, a minimum distance between an edge of the light emitting diode and the retaining wall is greater than a minimum distance between a boundary of the reflective layer close to the pad pin and the retaining wall.

In some exemplary embodiments, a sub-region with a small thickness of the light transmission protection layer is a region where a pad pin is located.

In another aspect, an embodiment of the present disclosure provides a display device including the light emitting substrate described above.

In another aspect, an embodiment of the present disclosure provides a method for preparing a light emitting substrate, used for preparing the light emitting substrate as described above, including: disposing multiple light emitting diodes on a base substrate; and forming a retaining wall defining multiple partitions on the base substrate, wherein at least one light emitting diode is provided in at least one partition.

In some exemplary embodiments, the method for preparing further includes: forming a light transmission protection layer covering the multiple light emitting diodes, and forming multiple concave structures on a first surface of the light transmission protection layer away from the base substrate.

In some exemplary embodiments, the method for preparing further includes forming a pad pin and a reflective layer in sequence on the base substrate; wherein the reflective layer is located on a side of the retaining wall close to the base substrate, the reflective layer exposes at least part of the pad pin, and the pad pin is connected to the light emitting diode.

Other aspects will become apparent upon reading and understanding the accompanying drawings and the detailed description.

BRIEF DESCRIPTION OF DRAWINGS

Accompanying drawings are used for providing an understanding of technical solutions of the present disclosure, forming a part of the specification, and are used for explaining the technical solutions of the present disclosure together with the embodiments of the present disclosure but not intended to form limitations on the technical solutions of the present disclosure. Shapes and sizes of one or more components in the drawings do not reflect true scales, but are only intended to schematically describe contents of the present disclosure.

DETAILED DESCRIPTION

Figure 1A:
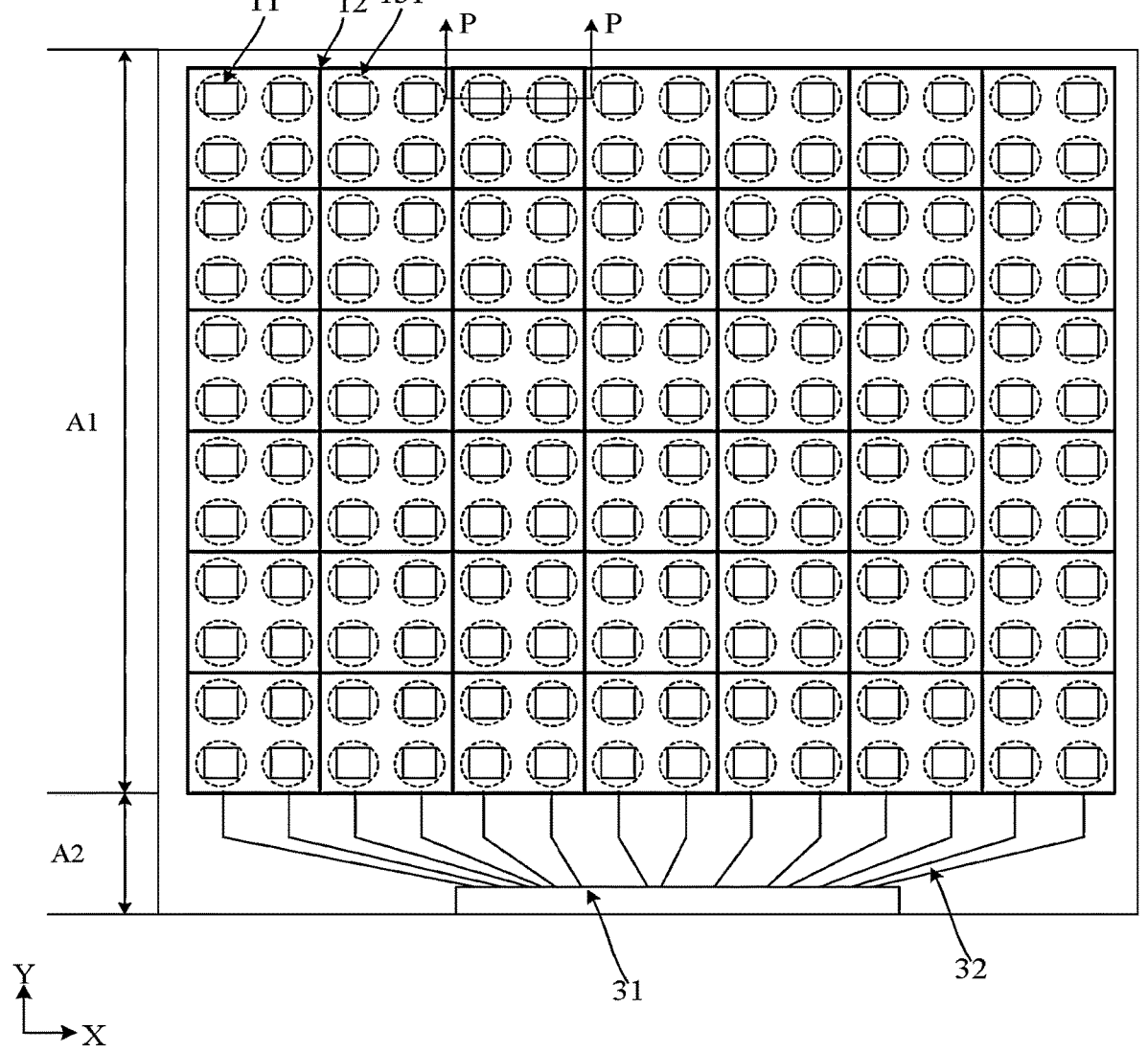
FIGS. 1A and 1B are schematic plan views of a light emitting substrate according to at least one embodiment of the present disclosure.

The embodiments of the present disclosure will be described below in combination with the drawings in detail. Implementations may be implemented in multiple different forms. Those of ordinary skills in the art may easily understand such a fact that implementation modes and contents may be transformed into one or more forms without departing from the purpose and scope of the present disclosure. Therefore, the present disclosure should not be explained as being limited to contents described in following implementation modes only. The embodiments in the present disclosure and features in the embodiments may be combined randomly with each other without conflict.

In the drawings, a size of one or more constituent elements, a thickness of a layer, or a region is sometimes exaggerated for clarity. Therefore, a mode of the present disclosure is not necessarily limited to the size, and a shape and a size of one or more components in the drawings do not reflect a true proportion. In addition, the drawings schematically illustrate ideal examples, and one implementation of the present disclosure is not limited to the shapes, numerical values, or the like shown in the drawings.

Ordinal numerals such as "first", "second" and "third" in the present disclosure are set to avoid confusion of constituent elements, but not intended for restriction in quantity. In the present disclosure, "multiple" represents two or more than two.

In the present disclosure, for convenience, wordings "central", "up", "down", "front", "back", "vertical", "horizontal", "top", "bottom", "inside", "outside" and the like indicating orientation or positional relationships are used to illustrate positional relationships between constituent elements with reference to the drawings. These wordings are not intended to indicate or imply that involved devices or elements must have specific orientations and be structured and operated in the specific orientations, but only to facilitate describing the present specification and simplify the description, and thus should not be understood as limitations on the present disclosure. The positional relationships between the constituent elements are changed as appropriate based on directions which are used for describing the constituent elements. Therefore, appropriate replacements may be made according to situations without being limited to the wordings described in the specification.

In the present disclosure, unless otherwise specified and defined, terms "mounting", "mutual connection" and "connection" should be understood in a broad sense. For example, a connection may be a fixed connection, or a detachable connection, or an integrated connection. It may be a mechanical connection or an electrical connection. It may be a direct mutual connection, or an indirect connection through middleware, or internal communication between two components. Those of ordinary skills in the art may understand meanings of the above-mentioned terms in the present disclosure according to situations. An "electrical connection" includes a case where constituent elements are connected together through an element with some electric action. "An element with some electric action" is not particularly limited as long as electrical signals between the connected constituent elements may be transmitted. Examples of "an element with some electric action" not only include electrodes and wirings, but also include switching elements (such as transistors), resistors, inductors, capacitors, other elements with one or more functions, etc.

In the present disclosure, "parallel" refers to a state in which an angle formed by two straight lines is above −10 degrees and below 10 degrees, and thus may include a state in which the angle is above −5 degrees and below 5 degrees. In addition, "perpendicular" refers to a state in which an angle formed by two straight lines is above 80 degrees and below 100 degrees, and thus may include a state in which the angle is above 85 degrees and below 95 degrees.

In the present disclosure, "film" and "layer" are interchangeable. For example, a "conductive layer" may be replaced with a "conductive film" sometimes. Similarly, an "insulating film" may be replaced with an "insulation layer" sometimes.

In the present disclosure, "about" and "approximate" refer to a case that a boundary is not defined strictly and process and measurement errors within a range are allowed.

At least one embodiment of the present disclosure provides a light emitting substrate, which includes a base substrate, a retaining wall disposed on the base substrate and multiple light emitting diodes. The retaining wall defines multiple partitions on the base substrate, and at least one light emitting diode is provided in at least one partition.

In the light emitting substrate provided according to an embodiment, multiple partitions are defined on the base substrate by the retaining wall, and multiple light emitting diodes are partitioned and isolated, so that light crosstalk between the partitions can be reduced, thereby reducing Halo phenomenon and achieving a better uniform light effect.

In some exemplary embodiments, the light emitting diode may be a Micro Light Emitting Diode (LED). The Micro LED may include a Micro Light Emitting Diode (Micro LED, Micro Light Emitting Diode) and a Mini LED, Mini Light Emitting Diode. However, the embodiment is not limited thereto.

In some exemplary embodiments, the light emitting substrate of the embodiment may serve as a backlight of the display device. For example, a light emitting diode is a micro-LED, because the micro-LED has advantages such as small size and high brightness, the picture contrast of display products using micro-LED backlight can reach the level of Organic Light Emitting Diode (OLED) display products, which can make products retain the technical advantages of Liquid Crystal Display (LCD), thus improving the display effect of pictures and providing users with better visual experience.

In some exemplary embodiments, in two cross sections of the retaining wall parallel to the plane in which the base substrate is located, an area of the cross section close to the base substrate is larger than an area of the cross section away from the base substrate. In this example, the area of the cross section of the retaining wall parallel to the plane in which the base substrate is located may gradually decrease in a direction away from the base substrate. However, the embodiment is not limited thereto.

In some exemplary embodiments, the material of the retaining wall may include reflective material. For example, the material of the retaining wall can be white glue with reflectivity greater than 95%. By using high reflectivity materials to prepare retaining walls, the light utilization rate of the light emitting substrate can be improved. However, the embodiment is not limited thereto.

In some exemplary embodiments, the retaining wall may include at least one of the following: multiple strip structures extending in a horizontal direction, and multiple strip structures extending in a vertical direction. In some examples, multiple strip structures extending in the horizontal direction and multiple strip structures extending in the vertical direction may be connected together to form a continuous structure, or strip structures extending in different directions may be discontinuous. The embodiment is not limited thereto.

In some exemplary embodiments, the retaining wall is a mesh structure, the mesh structure includes at least one mesh. At least one mesh may surround at least one light emitting diode. For example, at least one mesh surrounds multiple adjacent light emitting diodes. For example, each mesh can surround four light emitting diodes disposed in a matrix. Or, the numbers of light emitting diodes surrounded by different meshes may be different. In this example, a mesh can be used as a partition. However, the embodiment is not limited thereto. For example, the retaining wall may include multiple discontinuous strip structures.

In some exemplary embodiments, centerlines of light emitting surfaces of two adjacent light emitting diodes may be located in a first plane, and the first plane is perpendicular to the plane on which the base substrate is located. In some examples, a retaining wall extending in a single direction is provided between the two adjacent light emitting diodes. In some examples, the light emitting surface of a light emitting diode may be a plane passing through the geometric center of the light emitting diode and the normal of the plane in which the base substrate is located. The centerline of the light emitting surface of any light emitting diode passes through the geometric center of the light emitting diode and is perpendicular to the plane where the base substrate is located. A direction parallel to the first plane and intersecting with the centerline of the light emitting surface of the light emitting diode may be a first direction, for example, the first direction is located in the first plane and parallel to the plane where the base substrate is located. A direction parallel to the first plane and intersecting with the first direction may be a second direction, for example, the second direction is located in the first plane and perpendicular to the first direction. In some examples, the first direction and the second direction are both located in the first plane. The second direction may be parallel to the centerline of the light emitting surface of the light emitting diode, and the first direction is perpendicular to the centerline of the light emitting surface of the light emitting diode. However, the embodiment is not limited thereto.

In some exemplary embodiments, in the first plane, a ratio of the distance between adjacent edges of two adjacent light emitting diodes in the first direction to the maximum length of the retaining wall in the first direction is about 4.0 to 5.5, for example, it may be about 4.5. In this example, the maximum length of the retaining wall in the first direction is the length of the orthographic projection of the retaining wall extending in a single direction between two adjacent light emitting diodes on the base substrate in the first plane. The first plane is perpendicular to the plane where the base substrate is located and passes through the centerlines of the light emitting surfaces of the two adjacent light emitting diodes, and a retaining wall extending along a single direction is arranged between the two adjacent light emitting diodes. The first direction is parallel to the first plane and intersects with the centerline of the light emitting surface of the light emitting diode. For example, the first direction is perpendicular to the centerline of the light emitting surface of the light emitting diode.

In some exemplary embodiments, in the first plane, the ratio of the maximum length of the retaining wall in the second direction to the maximum length of the retaining wall in the first direction is about 0.5 to 0.8, e.g. about 0.625. The second direction is parallel to the first plane and intersects with the first direction. For example, the second direction is perpendicular to the first direction.

In some exemplary embodiments, the light emitting substrate may further include: a light transmission protection layer. The light transmission protection layer covers multiple light emitting diodes. In this example, the light emitting diode is covered by a light transmission protection layer to achieve the protection and encapsulation of the light emitting diode.

In some exemplary embodiments, the thickness of the light transmission protection layer corresponding to the geometrical central portion of each partition is greater than thicknesses of the light transmission protection layer corresponding to other regions. For example, in multiple partitions defined by the retaining wall, the light transmission protection layer is made by dripping transparent silica gel into each partition and then leveling and curing. Because the transparent silica gel is an organic material and dripping is adopted, the thickness of the final light transmission protection layer at the dripping position (usually at the geometric center of the partition) will be slightly larger than thicknesses at other positions.

In some exemplary embodiments, the light transmission protection layer has a first surface away from the base substrate, and the first surface has multiple concave structures. In this example, by forming multiple concave structures on the first surface of the light transmission protection layer, the path of light emitted by the light emitting diode can be changed to improve the uniform light effect.

In some exemplary embodiments, each of the multiple concave structures corresponds to each of the multiple light emitting diodes one-to-one, and an orthographic projection of one concave structure on the base substrate contains an orthographic projection of one light emitting diode on the base substrate.

In some exemplary embodiments, the concave structure has a hemispherical shape, and the center of the light emitting surface of the light emitting diode is located on the central axis of the hemispherical shape. However, the embodiment is not limited thereto. For example, the center of the light emitting surface of the light emitting diode may deviate from the central axis of the hemisphere.

In some exemplary embodiments, an orthographic projection of the light transmission protection layer on the base substrate is partially overlapped with an orthographic projection of the retaining wall on the base substrate. However, the embodiment is not limited thereto.

In some exemplary embodiments, a maximum thickness of the light transmission protection layer may be less than or equal to a maximum thickness of the retaining wall, wherein the thickness is a distance between a surface on a side away from the base substrate and a surface on a side close to the base substrate. There may be a height difference between the maximum thickness of the light transmission protection layer in the partition and the maximum thickness of the retaining wall.

In some exemplary embodiments, the light emitting substrate may further include: a diffusion film, a color conversion film, and a brightness enhancement film sequentially disposed on a side of the light transmission protection layer away from the base substrate. However, the embodiment is not limited thereto.

In some exemplary embodiments, the light emitting substrate may further include: a reflective layer and pad pins arranged on the base substrate. The reflective layer is located on the side of the retaining wall close to the base substrate, and exposes at least a portion of a pad pin. The pad pin is connected to the light emitting diode. In some examples, the reflective layer may completely expose the pad pin, or may expose a portion of the pad pin as long as the light emitting diode and the pad pin can be electrically connected, so that a drive circuit provided on the base substrate may be electrically connected to the light emitting diode through the pad pin to drive the light emitting element to emit light.

In some examples, the material of the reflective layer may include white ink, for example, may be a thermosetting ink or may be a light-curing ink. However, the embodiment is not limited thereto.

In some exemplary embodiments, in a plane perpendicular to the light emitting substrate, there is a spacing between an edge of the reflective layer and an edge of an adjacent light emitting diode. For example, the distance between the edge of the reflective layer and the edge of an adjacent light emitting diode may be about 150 microns.

Solutions of the embodiment will be described below through some examples.

Figure 1B:
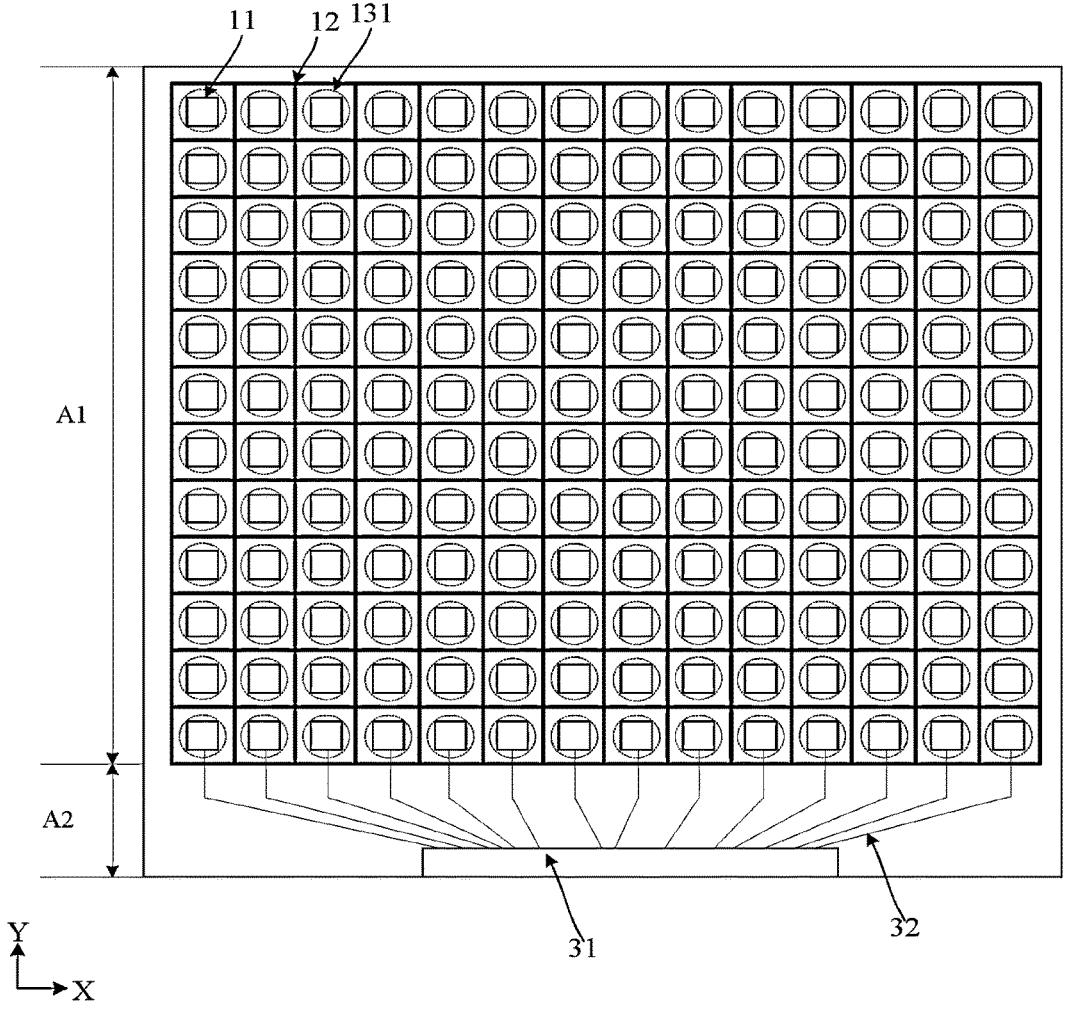
Figure 2:
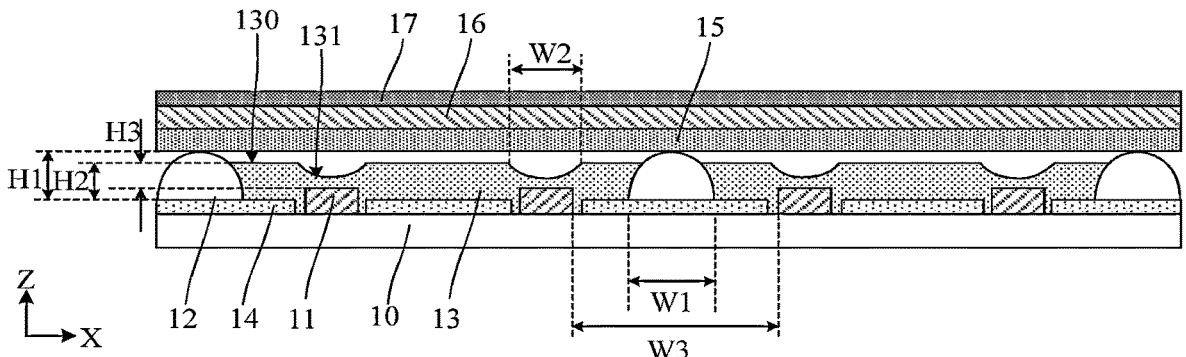
FIG. 2 is a schematic diagram of a partial section of a light emitting substrate according to at least one embodiment of the present disclosure.

FIGS. 1A and 1B are schematic plan views of a light emitting substrate according to at least one embodiment of the present disclosure. FIG. 2 is a schematic diagram of a partial section of a light emitting substrate according to at least one embodiment of the present disclosure. FIG. 2 is a schematic diagram of a partial sectiona along a P-P direction in FIG. 1A. FIG. 2 is a schematic cross-sectional diagram of the first plane. Wherein, the first plane is perpendicular to the plane where the base substrate 10 is located and passes through the centerlines of the light emitting surfaces of two adjacent light emitting diodes 11. In this example, the first plane is parallel to the row direction of a light emitting diode array. However, the embodiment is not limited thereto. For example, the first plane may be parallel to the column direction of the light emitting diode array. In some examples, the light emitting diode 11 may be a cuboid, and the centerline of the light emitting surface of the light emitting diode 11 is perpendicular to the plane in which the base substrate 10 is located. The light emitting surface of the light emitting diode 11 may be a plane passing through the geometric center of the light emitting diode 11 and the normal of the plane where the base substrate 10 is located. The centerline of the light emitting surface of the light emitting diode 11 may pass through the geometric center of the light emitting diode 11 and be parallel to the normal of the plane where the base substrate 10 is located (i.e., passing through the geometric center of the light emitting diode 11 and being perpendicular to the plane where the base substrate 10 is located).

In some exemplary embodiments, as shown in FIGS. 1A, 1B, and 2, the light emitting substrate of the embodiment includes a base substrate 10, a retaining wall 12 disposed on the base substrate 10, and multiple light emitting diodes 11. The retaining wall 12 and the multiple light emitting diodes 11 are located on the same side of the base substrate 10. Only several light emitting diodes 11 are schematically illustrated in FIGS. 1A and 1B, and the embodiment is not limited to the number of light emitting diodes 11 included in the light emitting substrate.

In some exemplary embodiments, as shown in FIGS. 1A and 1B, in a plane parallel to the light emitting substrate, the base substrate 10 may include a light emitting region A1 and a bonding region A2. The bonding region A2 may be located on one side of the light emitting region A1. However, the embodiment is not limited thereto. For example, the bonding region A2 may be located on multiple sides of the light emitting region A1. The light emitting region A1 of the base substrate 10 includes multiple drive circuits. The drive circuit is connected to the light emitting diode 11 and is configured to control the light emitting brightness of the light emitting diode 11. In some examples, the drive circuit may be a micro Integrated Circuit (micro IC) having a size on an order of micron or a pixel circuit including a Thin Film Transistor (TFT). The bonding region A2 may include multiple leads 32 and a bonding pad region 31. One terminal of at least one lead 32 is connected to a drive circuit in the light emitting region A1, and the other terminal is connected to a bonding pad in the bonding pad region 31. For example, the bonding pad may be configured to be connected to an external control circuit through a Flexible Printed Circuit (FPC), and the external control circuit controls the supply of a signal to the light emitting diode 11 to achieve light emitting of the light emitting diode 11. In some examples, the shape of the light emitting region A1 may be set as needed, for example, the outline of the light emitting region A1 may be rectangular. However, the embodiment is not limited thereto.

In some exemplary embodiments, the base substrate 10 includes a base and a drive circuit layer. The drive circuit layer is located in the light emitting region of the base substrate 10. The base may be a rigid base (e.g. glass, quartz) or a flexible base (e.g. flexible materials such as polyimide (PI) polyterephthalic acid (PET)). The drive circuit layer may include multiple drive circuits arranged in an array.

In some exemplary embodiments, the base substrate 10 may be a printed circuit board. However, the embodiment is not limited thereto.

In some exemplary embodiments, the light emitting brightness of each of the light emitting diodes 11 included in the light emitting substrate may be controlled by a drive circuit on the base substrate 10. In some examples, the light emitting substrate may serve as a light source of the passive display panel to improve the contrast of the display device to which the light emitting substrate is applied.

In some exemplary embodiments, multiple light emitting diodes 11 may be regularly provided in the light emitting region A1 of the base substrate 10. As shown in FIGS. 1A and 1B, multiple light emitting diodes 11 are arranged in an array in the light emitting region A1. In FIGS. 1A and 1B, a horizontal direction X may be a row direction of the light emitting diode array, and a vertical direction Y may be a column direction of the light emitting diode array. The horizontal direction X is perpendicular to the vertical direction Y. Multiple light emitting diodes 11 may be connected to a drive circuit on a base substrate 10. For example, each of the multiple light emitting diodes 11 is connected to each of the multiple drive circuits in one-to-one correspondence.

In some exemplary embodiments, as shown in FIG. 2, the surface of the base substrate 10 is provided with a reflective layer 14. Exemplarily, the reflective layer 14 may be formed by coating white ink. For example, the white ink may be a heat-curing ink or may be a light-curing ink. The reflective layer 14 may expose a pad pin of the drive circuit to be connected to the light emitting diode 11 to achieve an electrical connection between the drive circuit and the light emitting diode 11. In this example, the reflective layer 14 may cover a region other than a position to be connected to the light emitting diode 11 on the base substrate 10. The reflective layer 14 can reflect light toward a side away from the base substrate 10, thereby improving light utilization. In some examples, in a plane perpendicular to the light emitting substrate, the distance between the edge of the reflective layer 14 and the edge of an adjacent light emitting diode 11 may be about 150 microns. However, the embodiment is not limited thereto.

In some exemplary embodiments, the light emitting direction of the light emitting diode 11 is toward a side away from the base substrate 10. For example, the light emitting diode 11 may be an inorganic light emitting diode emitting blue light, and the size of the inorganic light emitting diode may be less than 500 microns (um), for example, the size may be about 80 um to 300 um. It can be understood that the light emitting diode 11 includes a light emitting structure formed by stacked semiconductor materials and an electrode pin, which are not distinguished in the figure.

Each of the light emitting diodes 11 may serve as a point light source, and the light emitting diodes 11 arranged in rows and columns form an area light source. However, the embodiment is not limited thereto. For example, the surface of the light emitting diode 11 may also include a light conversion material layer disposed on the light emitting side thereof, such as a phosphor layer or a quantum dot film layer, and the phosphor material in the phosphor layer or the quantum dot material in the quantum dot film layer may be excited by blue light to emit light of other colors (for example, white light).

In some exemplary embodiments, the retaining wall 12 may divide the light emitting region A1 of the light emitting substrate into multiple partitions, each of which is provided with at least one light emitting diode 11. As shown in FIG. 1A, a light emitting region A1 of the base substrate 10 is provided with multiple light emitting diodes 11 arranged in an array, and four light emitting diodes 11 provided in a 2*2 array may be provided in each partition defined by the retaining wall 12. As shown in FIG. 1B, a light emitting region A1 of the base substrate 10 is provided with multiple light emitting diodes 11 arranged in an array, and one light emitting diode 11 may be provided in each partition defined by the retaining wall 12. In this example, a same number of light emitting diodes 11 are provided in multiple partitions defined by the retaining wall 12 respectively. However, the embodiment is not limited thereto. For example, the numbers of light emitting diodes 11 provided in the multiple partitions defined by the retaining wall 12 may be different. Or, the light emitting diodes provided in the multiple partitions defined by the retaining wall 12 may be disposed in a non-array arrangement, and the non-array arrangement may be deliberately arranged or is caused by process deviation.

In some exemplary embodiments, the material of the retaining wall 12 may include a reflective material. The retaining wall 12 of this example may have a light reflection effect, thereby improving the utilization rate of light. However, the embodiment is not limited thereto.

In some exemplary embodiments, as shown in FIGS. 1A and 1B, the retaining wall 12 may be in a mesh structure that includes at least one mesh. In this example, a mesh is a partition. The number of light emitting diodes 11 surrounded by each mesh is not limited, for example, at least one mesh surrounds four adjacent light emitting diodes 11 or surrounds one light emitting diode 11. In some examples, the retaining wall 12 may include multiple strip structures extending in the horizontal direction X or may include multiple strip structures extending in the vertical direction Y.

In some exemplary embodiments, as shown in FIGS. 1A and 1B, the light emitting diodes 11 in each partition are surrounded by the retaining wall 12. However, the embodiment is not limited thereto. For example, the retaining wall 12 may partially surround at least one light emitting diode 11 to form a partition.

The light emitting diodes in each partition may be arranged regularly or the arrangement position is irregular due to process deviation. For example, multiple light emitting diodes in a partition have some horizontal (or vertical) misalignment rather than alignment. In some examples, a plane where the centerlines of the light emitting surfaces of the two nearest light emitting diodes that pass through the two sides of the retaining wall extending in a single direction (e.g. the strip structure extending horizontally or the strip structure extending vertically) are located can be defined as a first plane, and the first plane is perpendicular to the plane where the base substrate is located. In the first plane, the length of the orthographic projection of the strip structure extending in a single direction on the base substrate is the maximum length of the retaining wall along the first direction. Two nearest light emitting diodes respectively located on two sides of the retaining wall extending in a single direction means that there is not a third light emitting diode on a line segment obtained by connecting the geometric centers of the two light emitting diodes, and the line segment only intersects with the strip structure extending in a single direction. In some implementations, the retaining wall may be prepared by coating or printing, such as first preparing multiple strip structures extending in the horizontal direction and parallel to each other, and then preparing multiple strip structures extending in the vertical direction and parallel to each other. Since there may an overlapping region for the strip structure extending in the horizontal direction and parallel to each other and multiple strip structures extending in the vertical direction and parallel to each other, it may be understood that, in the preparation process, to simplify the process and shorten the time, for a strip structure extending in a horizontal direction and/or a vertical direction, the topography of the overlapping region and the topography of the non-overlapping region are different. For example, the thickness of the overlapping region in the direction perpendicular to the base substrate is slightly greater than the thickness of the non-overlapping region in the direction perpendicular to the base substrate, and the length of the overlapping region in the first direction is greater than the length of the non-overlapping region in the first direction.

In some exemplary embodiments, in the two cross sections of the retaining wall 12 parallel to the plane in which the base substrate 10 is located, an area of the cross section close to the base substrate 10 is larger than an area of the cross section away from the base substrate 10. As shown in FIG. 2, in the first plane, the length of the retaining wall 12 in the first direction gradually decreases from the base substrate 10 to the side away from the base substrate 10. The first direction is parallel to the first plane and perpendicular to the centerline of the light emitting surface of the light emitting diode 11, and the first direction may be perpendicular to the extending direction of the retaining wall 12. In this example, the first direction is parallel to the horizontal direction X. For example, in the first plane, the side surface of the retaining wall 12 away from the base substrate 10 may be a circular arc surface. As shown in FIG. 2, the cross section shape of the retaining wall 12 in the first plane may be semicircular. The side surface of the retaining wall 12 close to the adjacent light emitting diodes 11 may be an arc surface. However, the embodiment is not limited thereto. For example, the cross section shape of the retaining wall 12 in the first plane may be trapezoidal. The side surface of the retaining wall 12 close to the adjacent light emitting diodes 11 may be an inclined surface.

In some exemplary embodiments, as shown in FIG. 2, in the first plane, a distance between the adjacent edges of the two adjacent light emitting diodes 11 in the first direction is W3, a maximum length of the retaining wall 12 in the first direction (i.e., a length of an orthographic projection of the strip structure located between the two adjacent light emitting diodes 12 in the first plane on the base substrate 10) is W1, and a maximum length of the retaining wall 12 in the second direction Z is H1. The second direction Z is located in the same plane as the first direction and is perpendicular to the first direction. In this example, the second direction Z is a direction perpendicular to the base substrate 10. The distances between adjacent edges of any two adjacent light emitting diodes in the first direction of the multiple light emitting diodes 11 arranged in the array are substantially the same. However, the embodiment is not limited thereto.

In some examples, the ratio of W3 to W1 may be about 4.0 to 5.5, for example, about 4.5; the ratio of H1 to W1 can be about 0.5 to 0.8, for example about 0.625. The size of the retaining wall of the light emitting substrate provided in this example can achieve a better uniform light effect. However, the embodiment is not limited thereto.

In some exemplary embodiments, as shown in FIG. 2, in the first plane, the maximum length W1 of the retaining wall 12 in the first direction may be about 0.72 mm to 0.88 mm, for example, may be about 0.8 mm. The maximum length H1 of the retaining wall 12 in the second direction Z may be about 0.45 mm to 0.55 mm, for example about 0.5 mm. The size of the retaining wall of the light emitting substrate provided in this example can achieve a better uniform light effect. However, the embodiment is not limited thereto.

In some exemplary embodiments, as shown in FIG. 1A, FIG. 1B, and FIG. 2, multiple light emitting diodes 11 are covered with a light transmission protection layer 13. In some examples, an orthographic projection of the light transmission protection layer 13 on the base substrate 10 is partially overlapped with an orthographic projection of the retaining wall 12 on the base substrate 10. For example, the light transmission protection layer 13 may be located within the partition defined by the retaining wall 12 and covering at least one light emitting diode 11 (e.g. four light emitting diodes 11) within the partition. As shown in FIG. 2, in the first plane, the maximum thickness of the retaining wall 12 is the maximum length H1 in the second direction Z. The maximum thickness H2 of the light transmission protection layer 13 is less than the maximum thickness H1 of the retaining wall 12. In the present disclosure, a thickness refers to a distance between a surface on a side away from the base substrate 10 and a surface on a side close to the base substrate 10. In other examples, the maximum thickness H2 of the light transmission protection layer 13 may be equal to the maximum thickness H1 of the retaining wall 12. However, the embodiment is not limited thereto.

In some exemplary embodiments, as shown in FIG. 2, the light transmission protection layer 13 has a first surface 130 away from the base substrate 10, and the first surface 130 has multiple concave structures 131. As shown in FIGS. 1A and 1B, each of the multiple concave structures 131 correspond to the multiple light emitting diodes 11 one-to-one. That is, one concave structure 131 corresponds to one light emitting diode 11. An orthographic projection of a concave structure 131 on the base substrate 10 includes an orthographic projection of a light emitting diode 11 on the base substrate 10. In some examples, the orthographic projection of the light emitting diode 11 on the base substrate 10 may be rectangular and the orthographic projection of the concave structure 131 on the base substrate 10 may be circular. However, the embodiment is not limited thereto. For example, the shapes of the orthographic projections of the light emitting diode 11 and the concave structure 131 on the base substrate 10 may be the same.

In some exemplary embodiments, as shown in FIG. 2, the surface of the concave structure 131 may be a circular arc surface in the first plane. For example, the shape of the concave structure 131 may be hemispherical, and the center of the light emitting surface of the light emitting diode 11 may be located on the central axis of the hemispherical shape. However, the embodiment is not limited thereto. For example, there may be a deviation between the center of the light emitting surface of the light emitting diode 11 and the central axis of the hemisphere.

In some exemplary embodiments, as shown in FIG. 2, in the first plane, the length of the concave structure 131 in the first direction (i.e., the length of the orthographic projection of the concave structure 131 in the first plane on the base substrate) W2 may be about 0.72 mm to 0.88 mm, for example, may be about 0.8 mm. The maximum thickness H2 of the light transmission protection layer 13 may be about 0.36 mm to 0.44 mm, for example, about 0.4 mm. The distance H3 between the plane of the first surface 130, other than the concave structure 131, of the light transmission protection layer 13 and the surface of the light emitting diode 11 away from the base substrate 10 is about 0.144 mm to 0.176 mm, for example, about 0.16 mm. There is a gap between the concave structure 131 and the light emitting diode 11. Instead of direct contact, there is a gap between the bottom surface of the concave structure 131 in the second direction Z and the light emitting diode 11. The light transmission protection layer of the light emitting substrate of this example can protect the light emitting diode and play a better uniform light effect at the same time.

Figure 3:
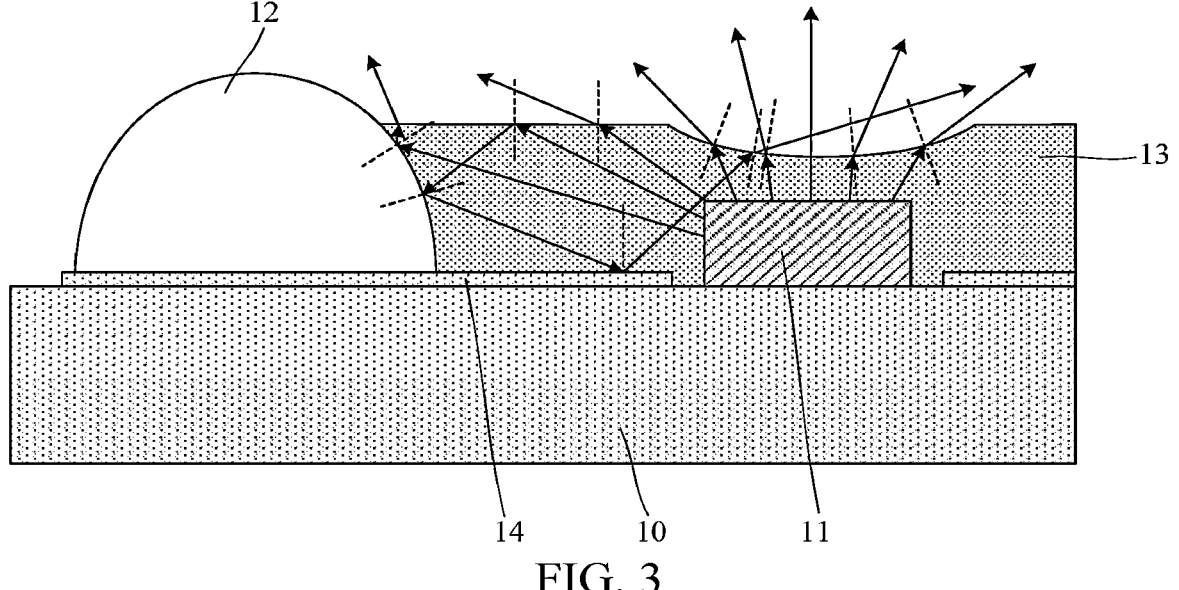
FIG. 3 is a schematic diagram of the light ray transmission according to at least one embodiment of the present disclosure.

FIG. 3 is a schematic diagram of the light ray transmission according to at least one embodiment of the present disclosure. In some exemplary embodiments, as shown in FIG. 3, a portion of the light emitted by the light emitting diode 11 continues to be transmitted after being refracted by the concave structure 131 of the light transmission protection layer 13, and a portion of the light is transmitted to the retaining wall 12 through the light transmission protection layer 13 and then is emitted from the light transmission protection layer 13 after being reflected by the retaining wall 12, or continues to be transmitted after being reflected by the reflective layer 14. As shown in FIG. 3, the path of the light emitted from the light emitting diode 11 may be changed (for example, the light is transmitted divergently) through the concave structure 131 of the light transmission protection layer 13, thereby achieving a better uniform light effect. In some examples, the refractive index of the light transmission protection layer 13 may be about 1.4 to 1.6, for example, it may be about 1.5 or 1.53. However, the embodiment is not limited thereto.

In some exemplary embodiments, as shown in FIG. 2, the light emitting substrate further includes a diffusion film 15, a color conversion film 16, and a brightness enhancement film 17 that are located on a side of the light transmission protection layer 13 away from the base substrate 10 and are sequentially disposed in a direction away from the base substrate 10. The color conversion film 16 is located between the diffusion film 15 and the brightness enhancement film 17. In the present example, the diffusion film 15 plays a light-uniforming role, and light spots formed by the light emitting diodes 11 arranged regularly can be shielded, so that the overall surface brightness of the light emitting substrate is uniform. The color conversion film 16 can convert blue light emitted by the light emitting diode 11 into white light. For example, the color conversion film may be a quantum dot (QD) film. The brightness enhancement film 17 can improve the backlight brightness after uniforming light. For example, the brightness enhancement film 17 may include at least one of the following: a Brightness Enhance Film (BEF), a Dual Brightness Enhancement Film (DBEF). However, the embodiment is not limited thereto. In some examples, when the light emitting diode emits white light, the color conversion film may not be provided.

Exemplary description is made below through a preparation process of a light emitting substrate. In an exemplary embodiment of the present disclosure, "an orthogonal projection of A includes an orthogonal projection of B" refers to that a boundary of the orthogonal projection of B falls within a boundary of the orthogonal projection of A, or the boundary of the orthogonal projection of A is overlapped with the boundary of the orthogonal projection of B.

Figure 4:
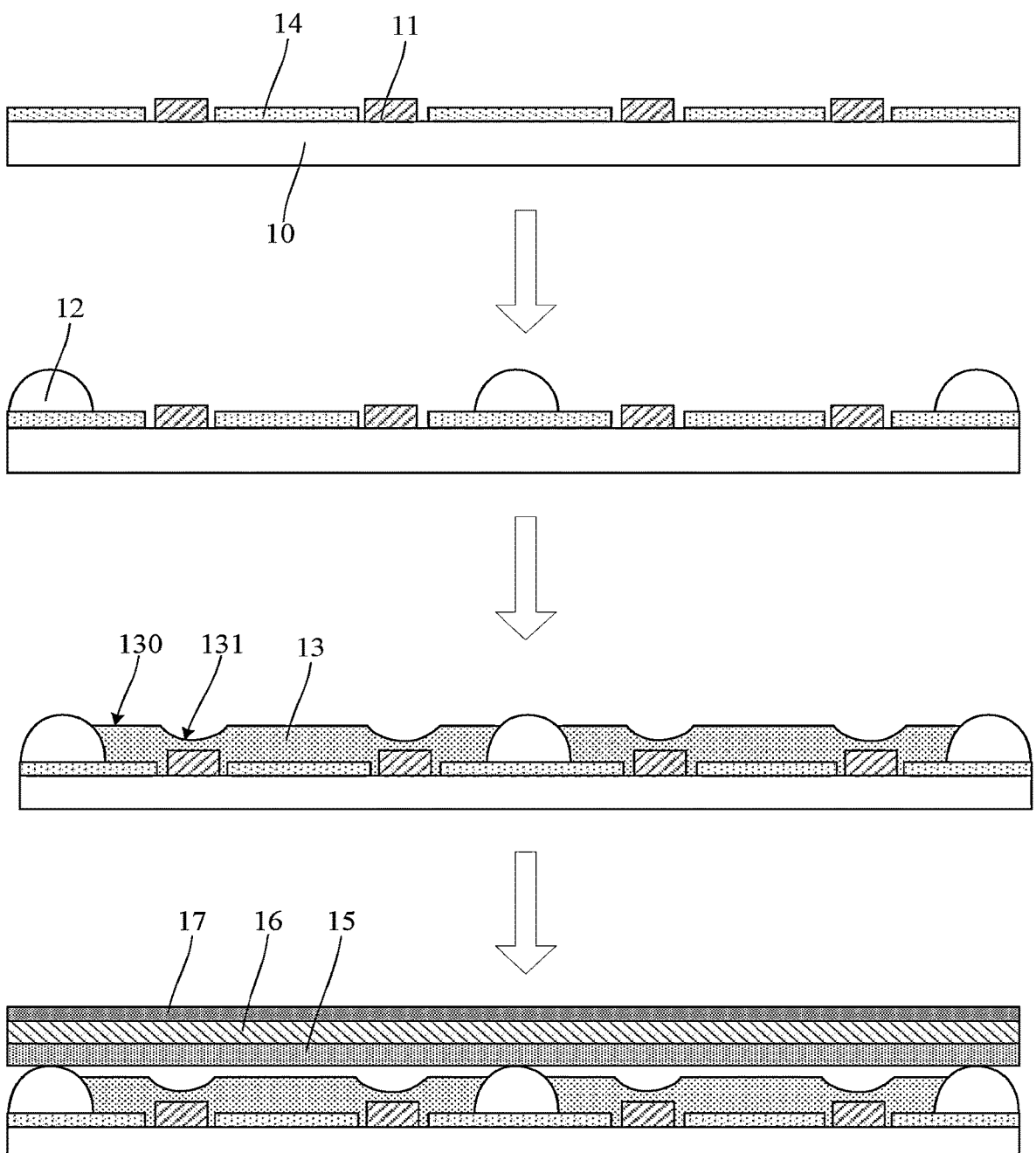
FIG. 4 is a schematic diagram of a preparation process of a light emitting substrate according to at least one embodiment of the present disclosure.
Figure 5:
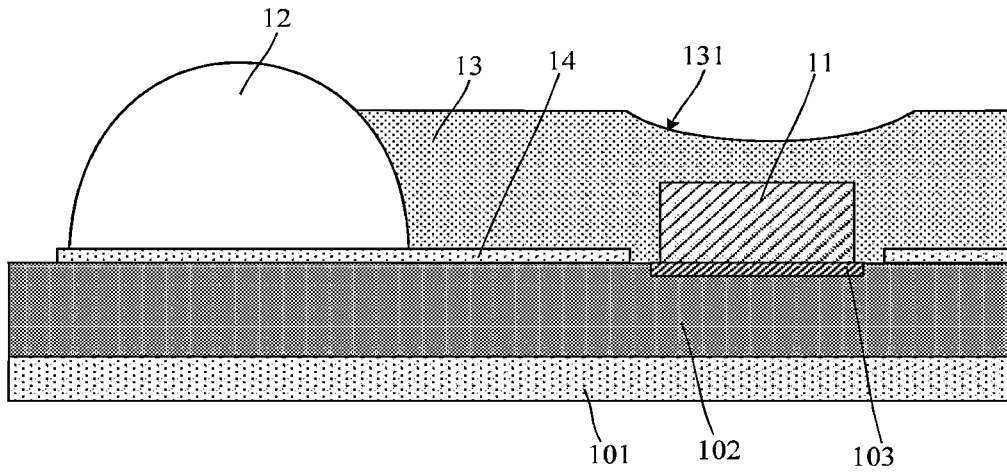
FIG. 5 is a schematic diagram of a partial section of a light emitting substrate according to at least one embodiment of the present disclosure.

In some exemplary implementations, as shown in FIGS. 4 and 5, a preparation process for the light emitting substrate may include the following operations.

(1) Preparing a Base Substrate.

In some exemplary embodiments, a base 101 is provided, and a drive circuit layer 102 is formed on the base 101 and then white ink is coated on the drive circuit layer 102 to form a reflective layer 14. The drive circuit layer 102 may include multiple drive circuits and multiple pad pins 103. The drive circuit may be electrically connected to the light emitting diode 11 through a pad pin 103. In some examples, the base 101 may be a rigid base or a flexible base. In some examples, a reflective layer 14 may be formed on a base substrate 10 between two adjacent light emitting diodes 11 by a coating process, exposing the pad pin 103 to be connected to an electrode pin of a light emitting diode 11. In some examples, the reflective layer 14 may completely expose the pad pin 103 or at least a portion of the pad pin 103. In the exemplary embodiment, by forming the reflective layer 14 on the base substrate 10, the light utilization ratio of the light emitting diode 11 can be improved, thereby improving the brightness of the light emitting substrate. In addition, when the brightness requirement is certain, the light emitting diode with low brightness can be selected, which can reduce the power consumption of the light emitting substrate.

(2) Transfer-Printing Multiple Light Emitting Diodes to a Base Substrate.

In some exemplary embodiments, the inorganic light emitting diodes may be massively transferred to the base substrate 10 by a mass transfer technique. In some examples, the electrode pins of the inorganic light emitting diodes may be bonded to the pad pins 103 exposed by the reflective layer 14 on the base substrate 10 by a conductive substance such as solder silver glue or the like.

In some examples, each light emitting diode 11 disposed on the base substrate 10 may be considered as a point light source. Multiple light emitting diodes 11 disposed in multiple rows and columns are provided on the base substrate 10, so that an area light source can be formed.

(3) Forming a Retaining Wall.

In some exemplary embodiments, the retaining wall 12 may be formed on the base substrate 10 by a dispensing or printing process. In some examples, the material of the retaining wall 12 may be a glue material of high reflectivity (e.g. a reflectivity greater than 95%) such as silicone epoxy acrylic and the like. However, the embodiment is not limited thereto.

(4) Forming a Light Transmission Protection Layer.

In some exemplary embodiments, a dispensing or infusion process is used to form a light transmission protection layer 13 in the partition defined by the retaining wall 12. The light transmission protection layer 13 covers the light emitting diode 11 to protect the light emitting diode 11 and prevent the light emitting diode 11 from die-dropping due to scratching. The light transmission protection layer 13 may cover the drive circuit layer 102. The maximum thickness of the light transmission protection layer 13 may be less than the maximum thickness of the retaining wall 12.

In some examples, in multiple partitions defined by the retaining wall 12, the light transmission protection layer 13 is obtained after leveling and curing by dripping transparent silica gel in each partition. Since the transparent silica gel is an organic material and dripping is adopted, the thickness of the light transmission protection layer 13 at the drip position (e.g. at the geometric center of the partition) may be slightly greater than the thicknesses at other positions.

In some exemplary embodiments, multiple concave structures 131 may be formed on the first surface 130 of the light transmission protection layer 13 away from the base substrate 10 by molding, transfer-printing, stamping, or the like to change the path of light emitted by the light emitting diodes 11 to achieve a better uniform light effect. In some examples, the shape of the concave structure 131 may be hemispherical. However, the embodiment is not limited thereto.

In some exemplary embodiments, the light transmission protection layer 13 may be made of materials such as silicone epoxy and acrylic. The light transmittance of the light transmission protection layer 13 can reach 99%.

(5) Sequentially Arranging a Diffusion Film, a Color Conversion Film and a Brightness Enhancement Film.

In some exemplary embodiments, the diffusion film 15, the color conversion film 16, and the brightness enhancement film 17 may be sequentially disposed on the side of the light transmission protection layer 13 away from the base substrate 10. The diffusion film 15, the color conversion film 16, and the brightness enhancement film 17 may cover the light emitting region of the base substrate 10. In some examples, the diffusion film 15 may be made of a material having a uniform light function to shield light spots formed by the light emitting diodes 11, so that the overall surface brightness is uniform. The color conversion film 16 can convert blue light emitted by the light emitting diode 11 into white light. The brightness enhancement film 17 may be a prism film for improving the brightness after uniforming light.

The manufacturing process of the light emitting substrate in accordance with an exemplary embodiment of the present disclosure may be compatible well with an existing manufacturing process, with a simple process, an easy implementation, a high production efficiency, a low production cost, and a high yield.

Figure 6A:
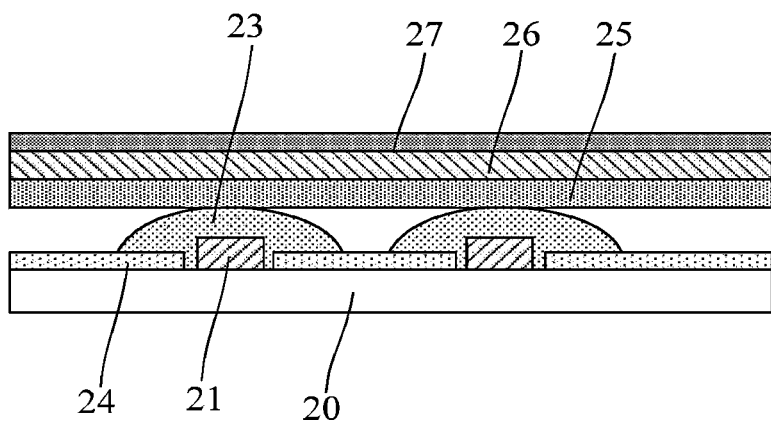
FIG. 6A is a schematic diagram of a structure of a light emitting substrate.
Figure 6B:
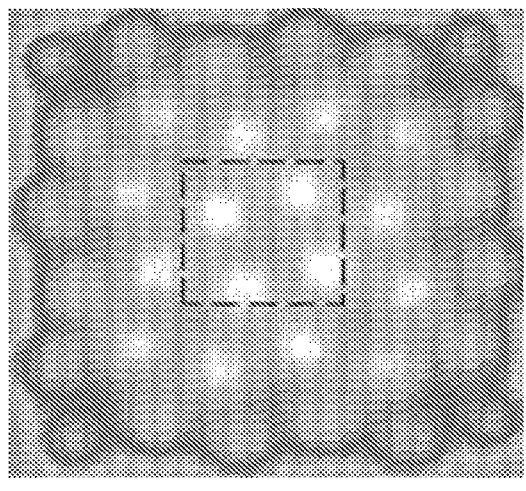
FIG. 6B is a schematic diagram of simulation of a uniform light effect of the light emitting substrate shown in FIG. 6A.

FIG. 6A is a schematic diagram of a structure of a light emitting substrate in the relevant technology. The light emitting substrate shown in FIG. 6A includes a base substrate 20, multiple light emitting diodes 21 disposed on the base substrate 20, a protection layer 23 covering the multiple light emitting diodes 21, a diffusion film 25, a color conversion film 26, and a brightness enhancement film 27 sequentially provided on the side of the protection layer 23 away from the base substrate 20. The surface of the base substrate 20 is provided with a reflective layer 24. The protection layer 23 has a convex surface structure. The light emitting diode 21 of the light emitting substrate shown in FIG. 6A is covered with a protection layer 23 having a convex structure and no retaining wall is provided on the base substrate 10. FIG. 6B is a schematic diagram of simulation of a uniform light effect of the light emitting substrate shown in FIG. 6A. The brightness uniformity of the light emitting substrate shown in FIG. 6A is about 72.5%.

Figure 7:
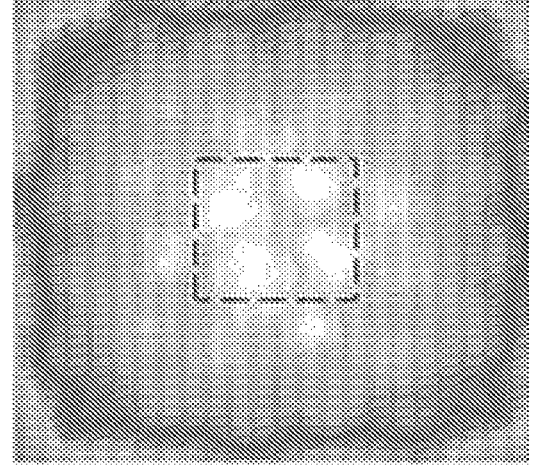
FIG. 7 is a schematic diagram of simulation of a uniform light effect of a light emitting substrate according to at least one embodiment of the present disclosure.

FIG. 7 is a schematic diagram of simulation of a uniform light effect of a light emitting substrate according to at least one embodiment of the present disclosure. As shown in FIG. 7, the brightness uniformity of the light emitting substrate of the embodiment can reach 85.4%. Referring to FIG. 6B and FIG. 7, it can be seen that the brightness uniformity of the light emitting substrate of the embodiment is significantly improved, and the uniform light effect can be improved.

At least one embodiment of the present disclosure further provides a method for preparing a light emitting substrate, used for preparing the light emitting substrate of the abovementioned embodiments. The method for preparing a light emitting substrate of the embodiment includes: disposing multiple light emitting diodes on a base substrate; and forming a retaining wall defining multiple partitions on the base substrate, wherein at least one light emitting diode is provided in at least one partition.

In some exemplary embodiments, the method for preparing of the embodiment may further include: forming a light transmission protection layer covering the light emitting diodes, and forming multiple concave structures on a first surface of the light transmission protection layer away from the base substrate.

In some exemplary embodiments, the method for preparing of the embodiment may further include: forming a pad pin and a reflective layer sequentially on the base substrate. The reflective layer is located on a side of the retaining wall close to the base substrate, and at least part of the pad pin is exposed by the reflective layer, and the pad pin is connected to the light emitting diode.

The method for preparing the light emitting substrate of the embodiment is as described above, so it will not be described here.

At least one embodiment of the present disclosure further provides a display device, which includes the light emitting substrate of an above exemplary embodiment.

Figure 8:
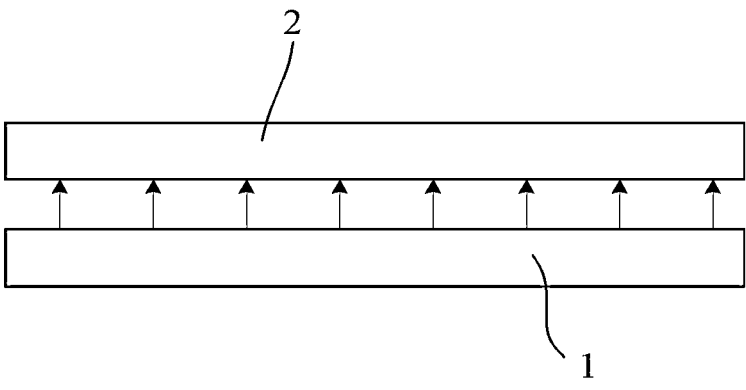
FIG. 8 is a schematic diagram of a display device according to at least one embodiment of the present disclosure.

FIG. 8 is a schematic diagram of a display device according to at least one embodiment of the present disclosure. As shown in FIG. 8, the display device of the embodiment may include: a light emitting substrate 1 and a display panel 2. The display panel 2 is located on the light emitting side of the light emitting substrate 1. In this example, the light emitting substrate 1 may serve as a straight-down backlight of the display panel 2. The display panel 2 may be an LCD display panel.

The drawings of the present disclosure only relate to structures involved in the present disclosure, and other structures may refer to conventional designs. The embodiments of the present disclosure and features in the embodiments may be combined to each other to obtain new embodiments if there is no conflict.

Those of ordinary skills in the art should understand that modifications or equivalent replacements of the technical solutions of the present disclosure may be made without departing from the spirit and scope of the technical solutions of the present disclosure, and shall all fall within the scope of the claims of the present disclosure.

The invention claimed is:

1. A light emitting substrate, comprising: a base substrate, a retaining wall disposed on the base substrate, and a plurality of light emitting diodes; wherein the retaining wall defines a plurality of partitions on the base substrate, and at least one light emitting diode is provided in at least one partition;

wherein centerlines of light emitting surfaces of two adjacent light emitting diodes are located in a first plane, and the first plane is perpendicular to a plane in which the base substrate is located;

wherein, in the first plane, a ratio of a distance W3 between adjacent edges of the two adjacent light emitting diodes in a first direction to a length W1 of an orthographic projection of a retaining wall between the two adjacent light emitting diodes on the base substrate is about 4.0 to 5.5; the first direction is parallel to the first plane and intersects with a centerline of a light emitting surface of the light emitting diode.

2. The light emitting substrate according to claim 1, wherein, in two cross sections of the retaining wall parallel to a plane in which the base substrate is located, an area of a cross section close to the base substrate is larger than an area of a cross section away from the base substrate.

3. The light emitting substrate according to claim 1, wherein a material of the retaining wall comprises a reflective material, wherein a surface of a side of the retaining wall away from the base substrate is a circular arc surface, wherein a side surface of the retaining wall close to adjacent light emitting diodes is an arc surface or an inclined surface.

4. The light emitting substrate according to claim 1, wherein the retaining wall comprises at least one of the following: a plurality of strip structures extending in a horizontal direction, and a plurality of strip structures extending in a vertical direction.

5. The light emitting substrate according to claim 1, wherein the retaining wall is a mesh structure, the mesh structure comprises at least one mesh.

6. The light emitting substrate according to claim 5, wherein each mesh surrounds at least one light emitting diode, wherein numbers of light emitting diodes surrounded by different meshes are different, wherein each mesh surrounds four light emitting diodes arranged in a matrix.

7. The light emitting substrate according to claim 1, wherein a retaining wall extending in a single direction is provided between the two adjacent light emitting diodes, wherein a shape of a cross section of the retaining wall in the first plane is semicircular or trapezoidal, wherein, in the first plane, a length of the retaining wall in a first direction gradually decreases from the base substrate to a side away from the base substrate; the first direction is parallel to the first plane and intersects with a centerline of a light emitting surface of the light emitting diode.

8. The light emitting substrate according to claim 7, wherein, in the first plane, a ratio of a maximum length H1 of the retaining wall in a second direction to a length W1 of an orthographic projection of a retaining wall between the two adjacent light emitting diodes on the base substrate is about 0.5 to 0.8, the second direction is located in the same plane as the first direction and is perpendicular to the first direction, wherein, in the first plane, the length W1 of the orthographic projection of the retaining wall between the two adjacent light emitting diodes on the base substrate is 0.72 mm to 0.88 mm; the maximum length H1 of the retaining wall along the second direction is 0.45 mm to 0.55 mm.

9. The light emitting substrate according to claim 1, further comprising: a light transmission protection layer, wherein the light transmission protection layer covers the plurality of light emitting diodes, wherein a thickness of the light transmission protection layer corresponding to a geometrical central portion of each partition is greater than thicknesses of the light transmission protection layer corresponding to other regions.

10. The light emitting substrate according to claim 9, wherein the light transmission protection layer has a first surface away from the base substrate, and the first surface has a plurality of concave structures, wherein each of the plurality of concave structures corresponds to each of the plurality of light emitting diodes one-to-one, and an orthographic projection of one concave structure on the base substrate contains an orthographic projection of one light emitting diode on the base substrate, wherein a concave structure has a hemispherical shape, and a center of a light emitting surface of the light emitting diode is located on a central axis of the hemispherical shape.

11. The light emitting substrate according to claim 10, wherein, in the first plane, a length W2 of an orthographic projection of a concave structure on the base substrate is about 0.72 mm to 0.88 mm, wherein a distance H3 between a plane of the first surface of the light transmission protection layer other than a concave structure and a surface of the light emitting diode away from the base substrate is about 0.144 mm to 0.176 mm.

12. The light emitting substrate according to claim 9, wherein an orthographic projection of the light transmission protection layer on the base substrate is partially overlapped with an orthographic projection of the retaining wall on the base substrate.

13. The light emitting substrate according to claim 9, wherein a maximum thickness of the light transmission protection layer is less than or equal to a maximum thickness of the retaining wall, wherein a thickness is a distance between a surface on a side away from the base substrate and a surface on a side close to the base substrate, wherein a maximum thickness of the light transmission protection layer is about 0.36 mm to 0.44 mm, wherein a sub-region with a small thickness of the light transmission protection layer is a region where a pad pin is located.

14. The light emitting substrate according to claim 9, further comprising: a diffusion film, a color conversion film, and a brightness enhancement film sequentially disposed on a side of the light transmission protection layer away from the base substrate.

15. The light emitting substrate according to claim 1, further comprising: a reflective layer and a pad pin disposed on the base substrate; wherein the reflective layer is located on a side of the retaining wall close to the base substrate, and the reflective layer exposes at least part of the pad pin; the pad pin is connected to the light emitting diode, wherein a minimum distance between an edge of the light emitting diode and the retaining wall is greater than a minimum distance between a boundary of the reflective layer close to the pad pin and the retaining wall, wherein a material of the reflective layer comprises white ink, wherein, in a plane perpendicular to the light emitting substrate, there is a spacing between an edge of the reflective layer and an edge of an adjacent light emitting diode.

16. The light emitting substrate according to claim 1, further comprising: a drive circuit, which is a micro integrated circuit having a size on an order of micron or a pixel circuit comprising a thin film transistor, wherein the drive circuit is covered by a light transmission protection layer.

17. A display device, comprising a light emitting substrate according to claim 1.

18. A method for preparing a light emitting substrate, used for preparing the light emitting substrate according to claim 1, comprising:

disposing a plurality of light emitting diodes on a base substrate; and forming a retaining wall defining a plurality of partitions on the base substrate, wherein at least one light emitting diode is provided in at least one partition.

19. The method according to claim 18, further comprising: forming a light transmission protection layer covering the plurality of light emitting diodes, and forming a plurality of concave structures on a first surface of the light transmission protection layer away from the base substrate, and forming a pad pin and a reflective layer in sequence on the base substrate; wherein the reflective layer is located on a side of the retaining wall close to the base substrate, the reflective layer exposes at least part of the pad pin, and the pad pin is connected to the light emitting diode.

* * * * *